(12) United States Patent
Kim et al.

(10) Patent No.: US 12,073,902 B2
(45) Date of Patent: Aug. 27, 2024

(54) MEMORY, MEMORY SYSTEM, OPERATION METHOD OF THE MEMORY, AND OPERATION OF THE MEMORY SYSTEM

(71) Applicant: SK hynix Inc., Gyeonggi-do (KR)

(72) Inventors: Kyung Whan Kim, Gyeonggi-do (KR); Sun Hwa Park, Gyeonggi-do (KR); Kee Yun Kim, Gyeonggi-do (KR); Sung Joo Ha, Gyeonggi-do (KR); Ah Reum Han, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/077,795

(22) Filed: Dec. 8, 2022

(65) Prior Publication Data

US 2023/0116422 A1 Apr. 13, 2023

Related U.S. Application Data

(63) Continuation of application No. 17/075,268, filed on Oct. 20, 2020, now Pat. No. 11,557,366.

(30) Foreign Application Priority Data

Nov. 21, 2019 (KR) .................. 10-2019-0150511
Jun. 5, 2020 (KR) .................. 10-2020-0068144

(51) Int. Cl.
| | |
|---|---|
| *G11C 29/42* | (2006.01) |
| *G06F 11/14* | (2006.01) |
| *G11C 29/00* | (2006.01) |
| *G11C 29/18* | (2006.01) |
| *G11C 29/30* | (2006.01) |
| *G11C 29/44* | (2006.01) |

(52) U.S. Cl.
CPC .......... *G11C 29/42* (2013.01); *G06F 11/1451* (2013.01); *G06F 11/1469* (2013.01); *G11C 29/30* (2013.01); *G11C 29/44* (2013.01); *G11C 29/702* (2013.01); *G11C 29/785* (2013.01); *G11C 2029/1802* (2013.01)

(58) Field of Classification Search
None
See application file for complete search history.

(56) References Cited

U.S. PATENT DOCUMENTS

2016/0307645 A1* 10/2016 Kim ................. G11C 29/76
2019/0073298 A1* 3/2019 Wang ............... G06F 12/0269

* cited by examiner

*Primary Examiner* — Guerrier Merant
(74) *Attorney, Agent, or Firm* — IP & T GROUP LLP

(57) ABSTRACT

A method for operating a memory includes determining to perform an error correction operation; determining whether to perform an error correction operation; generating an internal address when the error correction operation is performed; reading data from memory cells that are selected based on the internal address and an error correction code corresponding to the data; performing an error correction operation on the data based on the error correction code to produce an error-corrected data; writing the error-corrected data and an error correction code corresponding to the error-corrected data into the memory cells; determining one or more regions among regions in the memory as a repair-requiring region based on an error detected when the error correction operation is performed; receiving a first command; backing up the data and the error correction code into a redundant region in response to the first command; and repairing the repair-requiring region with the redundant region.

10 Claims, 9 Drawing Sheets

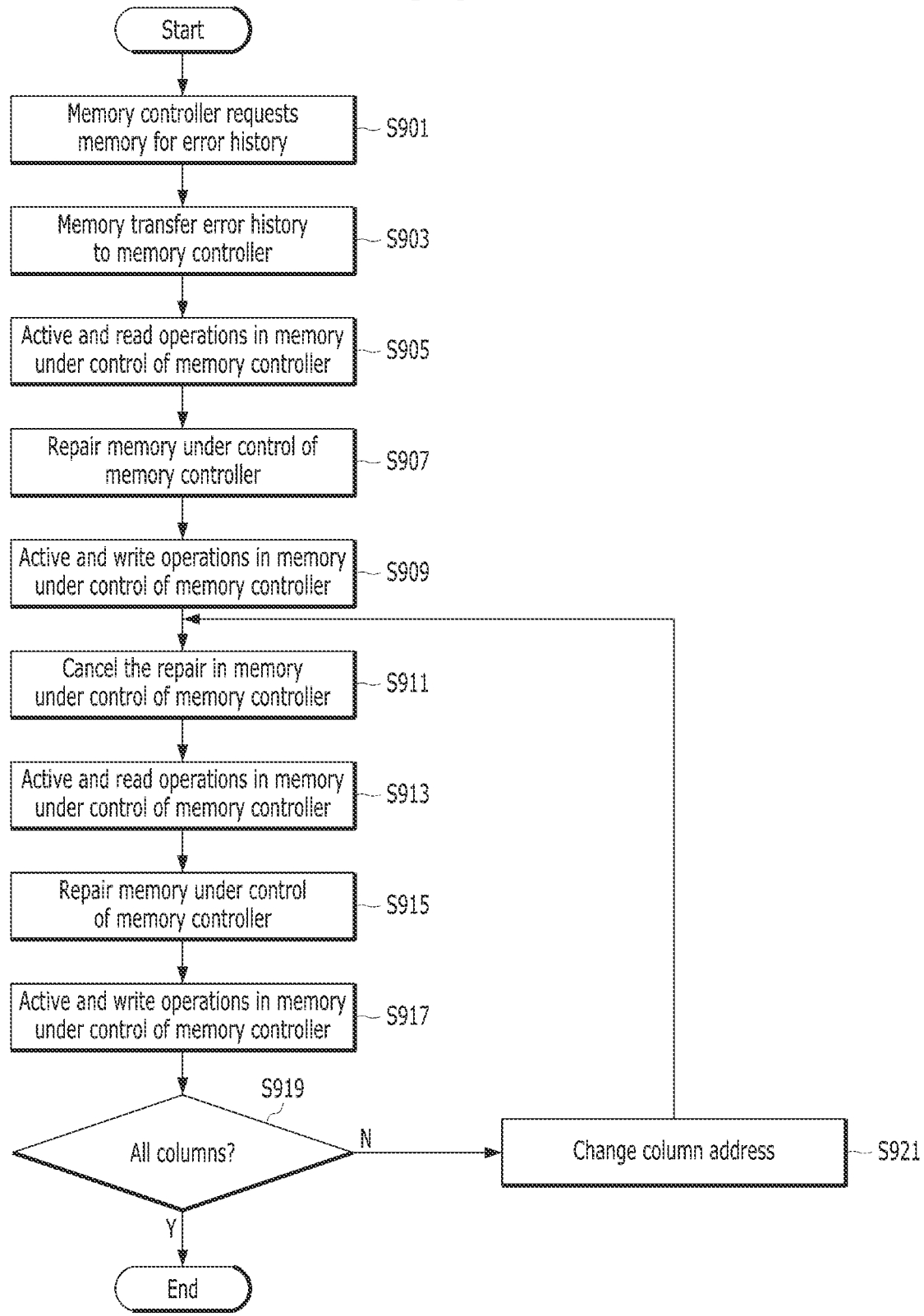

MEMORY, MEMORY SYSTEM, OPERATION METHOD OF THE MEMORY, AND OPERATION OF THE MEMORY SYSTEM

CROSS-REFERENCE TO RELATED APPLICATIONS

The present application is a continuation of U.S. patent application Ser. No. 17/075,268 filed on Oct. 20, 2020, which claims priority to Korean Patent Application No. 10-2019-0150511, filed on Nov. 21, 2019, and Korean Patent Application No. 10-2020-0068144, filed on Jun. 5, 2020. The entire disclosure of each of the foregoing applications is incorporated herein by reference in its entirety.

BACKGROUND

1. Field

Embodiments of the present invention relate to a memory and a memory system.

2. Description of the Related Art

In the early days of the semiconductor memory industry, there were many original good dies, which are dies with no defective memory cells, in a memory chip that has passed a semiconductor fabrication process on the wafer. However, as the capacity of memory devices gradually increases, it becomes difficult to make a memory device completely free of a defective memory cell, and at present, it may be said that there is likely no possibility that a memory device with no defective memory cell is fabricated. As one solution to overcome this situation, a method of repairing defective memory cells of a memory device with redundant memory cells is being used.

As another solution, an error correction circuit (i.e., ECC circuit) that corrects an error in a memory system is used to correct an error occurring in a memory cell and an error occurring while data are transferred during a read operation and a write operation of the memory system.

SUMMARY

Embodiments of the present invention are directed to a technology for reducing errors in a memory and a memory system.

In accordance with an embodiment of the present invention, a method for operating a memory includes: determining whether to perform an error correction operation; generating an internal address in response to the determination of performing the error correction operation; reading data from memory cells that are selected based on the internal address and an error correction code corresponding to the data; performing an error correction operation on the data based on the error correction code to produce an error-corrected data; writing the error-corrected data and an error correction code corresponding to the error-corrected data into the memory cells; determining one or more regions among regions in the memory as a repair-requiring region based on an error detected when the error correction operation is performed; receiving a first command; backing up the data and the error correction code, which are stored in the repair-requiring region, into a redundant region in response to the first command; and repairing the repair-requiring region with the redundant region.

In accordance with another embodiment of the present invention, a memory includes: a normal cell array; a redundant cell array; an access circuit for accessing the normal cell array and the redundant cell array; an address generating circuit that generates an internal address in response to a determination of performing an error correction operation; an error correction code generating circuit that generates an error correction code corresponding to write data, based on the write data; an error correction circuit that detects and corrects an error of read data based on an error correction code corresponding to the read data; a history storage circuit that determines one or more regions among regions of the normal cell array as a repair-requiring region based on the error detected by the error correction circuit; and a repair circuit for replacing the repair-requiring region of the normal cell array with a redundant region of the redundant cell array, wherein when the first command is applied, the access circuit performs backup of the data and the error correction codes, which are stored in the repair-requiring region of the normal cell array, into the redundant region, and the repair circuit replaces the repair-requiring region with the redundant region after the backup is completed.

In accordance with yet another embodiment of the present invention, a method for operating a memory system includes: determining, by a memory, whether to perform an error correction operation; generating, by the memory, an internal address in response to the determination of performing the error correction operation; reading, by the memory, data and an error correction code corresponding to the data from memory cells that are selected based on the internal address; performing, by the memory, an error correction operation on the data based on the error correction code; writing, by the memory, error-corrected data and an error correction code corresponding to the error-corrected data into the memory cells selected based on the internal address; determining, by the memory, one or more regions among regions as a repair-requiring region based on an error detected when the memory performs the error correction operation; moving, by the memory controller, data of the repair-requiring region into a first region of the memory; transferring, by the memory controller, a first command to the memory; repairing, by the memory, the repair-requiring region with a redundant region of the memory in response to the first command; and moving, by the memory controller, data of the first region into the redundant region.

The moving of the data of the repair-requiring region into the first region of the memory through the memory controller may include: reading the data and the error correction code from the repair-requiring region; correcting an error of the data that are read from the repair-requiring region based on the error correction code which is read from the repair-requiring region to produce an error-corrected data; transferring, by the memory, the error-corrected data to the memory controller; transferring, by the memory controller, the error-corrected data to the memory; generating, by the memory, an error correction code based on the error-corrected data; and writing, by the memory, the error-corrected data and the error correction code corresponding to the error-corrected data into the first region.

The error correction operation may be determined to be performed in response to a second command which is transferred from the memory controller to the memory.

In accordance with still another embodiment of the present invention, a memory includes: a normal cell array; a redundant cell array; an access circuit for accessing the normal cell array and the redundant cell array; an address generating circuit that generates an internal address in response to a determination of performing an error correction operation; an error correction code generating circuit that generates an error correction code corresponding to write data, based on the write data; an error correction circuit that detects and corrects an error of the read data based on an error correction code corresponding to the read data; a history storage circuit that determines one or more regions among regions of the normal cell array as a repair-requiring region based on an error detected by the error correction circuit; and a repair circuit for replacing the repair-requiring region of the normal cell array with a redundant region of the redundant cell array, wherein when a first command is applied, the repair circuit replaces the repair-requiring region with the redundant region.

Prior to the application of the first command, the data in the repair-requiring region may be moved to a first region of the memory under the control of the memory controller, and after the first command is applied, data in the first region of the memory may be moved to the redundant region under the control of the memory controller.

The error correction operation may be determined to be performed by receiving a second command.

In accordance with still another embodiment of the present invention, a method for operating a memory system includes: determining, by a memory, whether to perform an error correction operation; generating, by the memory, an internal address in response to the determination of performing the error correction operation; reading, by the memory, data and an error correction code corresponding to the data from memory cells that are selected based on the internal address; performing, by the memory, an error correction operation on the data based on the error correction code; writing, by the memory, error-corrected data and an error correction code corresponding to the error-corrected data into the memory cells selected based on the internal address; determining, by the memory, one or more regions among regions as a repair-requiring region based on an error detected when the memory performs the error correction operation; transferring, by the memory, information on the repair-requiring region to the memory controller upon a request of the memory controller; determining, by the memory controller, whether there is no data necessary for the repair-requiring region; transferring, by the memory controller, a first command to the memory; and repairing, by the memory, the repair-requiring region with a redundant region of the memory in response to the first command.

The error correction operation may be determined to be performed in response to a second command, which is transferred from the memory controller to the memory.

In accordance with still another embodiment of the present invention, a method for operating a memory system includes: determining, by the memory, whether to perform an error correction operation; generating, by the memory, an internal address in response to the determination of performing the error correction operation; reading, by the memory, data and an error correction code corresponding to the data from memory cells that are selected based on the internal address; performing, by the memory, an error correction operation on the data based on the error correction code; writing, by the memory, error-corrected data and an error correction code corresponding to the error corrected data into the memory cells that are selected based on the internal address; determining, by the memory, one or more regions among regions as a repair-requiring region based on an error which is detected when the memory performs the error correction operation; transferring, by the memory, first data read from the repair-requiring region to a memory controller; applying, by the memory controller, a first command to the memory; repairing, by the memory, the repair-requiring region with a redundant region of the memory in response to the first command; transferring, by the memory controller, the first data to the memory such that the first data is written into the redundant region; applying, by the memory controller, a second command to the memory; canceling, by the memory, the repair in response to the second command; transferring, by the memory, second data that are read from the repair-requiring region to the memory controller; applying, by the memory controller, a third command to the memory; repairing, by the memory, the repair-requiring region with a redundant region of the memory in response to the third command; and transferring, by the memory controller, the second data to the memory such that the second data is written into the redundant region.

The error correction operation may be determined to be performed in response to a fourth command, which is transferred from the memory controller to the memory, and wherein the first command may be a repair command.

The second command may be a command to cancel a previous repair operation, and wherein the third command may be a command for performing the previous repair operation again.

The repair operation may be a soft repair operation.

In accordance with still another embodiment of the present invention, a method for operating a memory system includes: transferring, by a memory controller, a first command to a memory; repairing, by the memory, a normal region of a normal cell array with a redundant region of a redundant cell array in response to the first command; transferring, by the memory controller, a second command to the memory; canceling, by the memory, the repair in response to the second command; transferring, by the memory, first data that are read from the normal region; transferring, by the memory controller, a third command to the memory; repairing, by the memory, the normal region with the redundant region again in response to the third command; and transferring, by the memory controller, the first data to the memory such that the first data is written into the redundant region.

The method may further comprise: transferring, by the memory controller, a second command to the memory again; canceling, by the memory, the repair again in response to the second command; transferring, by the memory, second data that are read from the normal region to the memory controller; transferring, by the memory controller, a third command to the memory again; repairing, by the memory, the normal region with the redundant region again in response to the third command; and transferring, by the memory controller, the second data to the memory such that the second data is written into the redundant region.

The first command may be a repair command, the second command may be a command to cancel a previous repair operation, and the third command may be a command for performing the previous repair operation again.

The repair operation may be a soft repair operation.

In accordance with still another embodiment of the present invention, a memory includes: a normal cell array; a redundant cell array; an access circuit for accessing the normal cell array and the redundant cell array; and a repair circuit that performs a repair operation of replacing a portion of the normal cell array with a redundant region of the redundant cell array when a first command is applied, cancelling a previous repair operation when a second command is applied, and performing the previous repair operation again when a third command is applied.

The memory may further comprise: an address generating circuit that generates an internal address in response to a fourth command; an error correction code generating circuit that generates an error correction code corresponding to write data based on the write data; an error correction circuit that corrects an error in read data based on an error correction code corresponding to the read data; and a history storage circuit that determines one or more regions among regions of the normal cell array as a repair-requiring region based on an error detected by the error correction circuit.

The repair operation performed by the repair circuit may be a soft repair operation.

In accordance with still another embodiment of the present invention, a memory system includes: a memory controller configured to transmit a repair command; and a memory device configured to receive the repair command, wherein the memory device includes: a memory cell array including a plurality of cells coupled to a repair-requiring normal row and a redundant row; an access circuit configured to activate the repair-requiring normal row and the redundant row in response to the repair command, and back up data, which is stored in cells coupled to the repair-requiring normal row into cells coupled to the redundant row; and a repair circuit configured to replace the repair-requiring normal row with the redundant row after the data is backed up.

BRIEF DESCRIPTION OF THE DRAWINGS

FIG. 9 is a flowchart describing a fourth embodiment of a repair operation performed in the memory system of FIG. 1.

DETAILED DESCRIPTION

Figure 1:
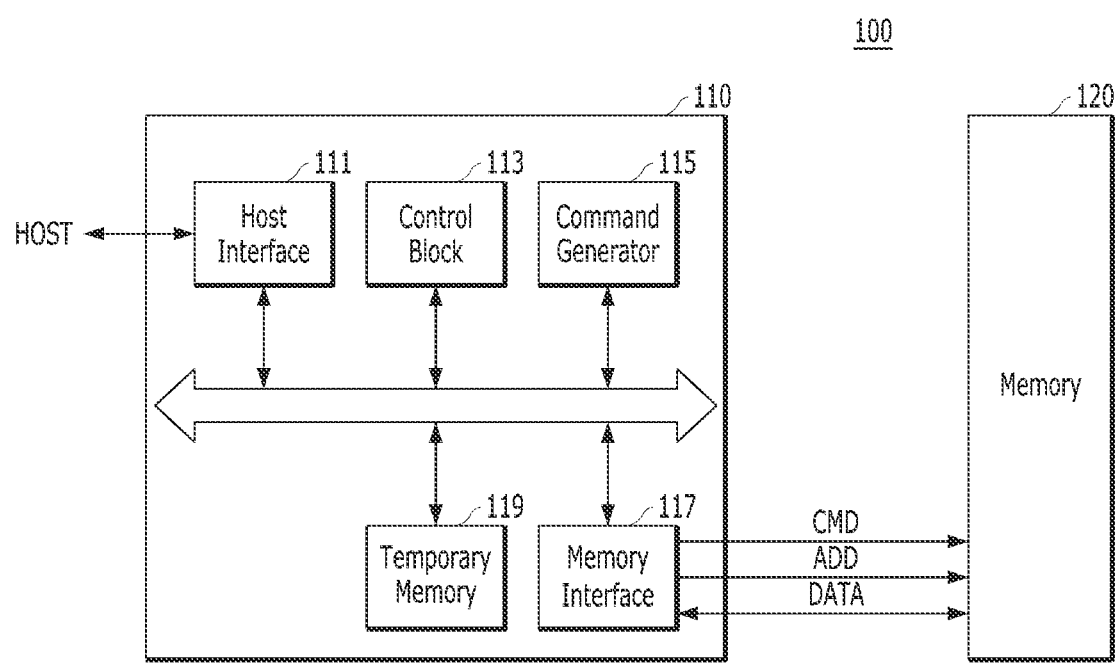
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system 100 in accordance with an embodiment of the present invention.

Referring to FIG. 1, the memory system 100 may include a memory controller 110 and a memory 120.

The memory controller 110 may control the operation of the memory 120 according to a request of a host HOST. The host HOST may include a Central Processing Unit (CPU), a Graphic Processing Unit (GPU), an Application Processor (AP), and the like. The memory controller 110 may include a host interface 111, a control block 113, a command generator 115, a memory interface 117, and a temporary memory 119. The memory controller 110 may be configured outside the host HOST. Alternatively, the memory controller 110 may be included in a CPU, a GPU, an AP, or the like. In this case, the host HOST may represent a constituent element other than the memory controller 110 in this configuration. For example, when the memory controller 110 is included in a CPU, the host HOST in the drawing may represent other constituent elements except for the memory controller 110 in the CPU.

The host interface 111 may be an interface for communication between the host HOST and the memory controller 110.

The control block 113 may control the overall operation of the memory controller 110 and schedule an operation to be directed to the memory 220. To improve the performance of the memory 120, the control block 113 may change the order of requests received from the host HOST and the order of operations to be directed to the memory 120. For example, even though the host HOST first requests the memory 120 for a read operation and then requests the memory 120 for a write operation, the order may be adjusted such that the write operation is performed prior to the read operation.

The command generator 115 may generate a command to be applied to the memory 120 according to the order of the operations determined by the control block 113.

The memory interface 117 may be an interface between the memory controller 110 and the memory 120. A command CMD and an address ADD may be transferred from the memory controller 110 to the memory 120 through the memory interface 117, and data DATA may be transferred and/or received between the memory controller 110 and the memory 120. The memory interface 117 may also be referred to as a PHY interface.

The temporary memory 119 may be a memory that temporarily stores data that are read from the memory 120 or temporarily stores data to be written into the memory 120. The temporary memory may be a Static Random Access Memory (SRAM).

The memory 120 may perform an operation that is directed by the memory controller 110. The memory 120 will be described in detail with reference to FIG. 2.

Figure 2:
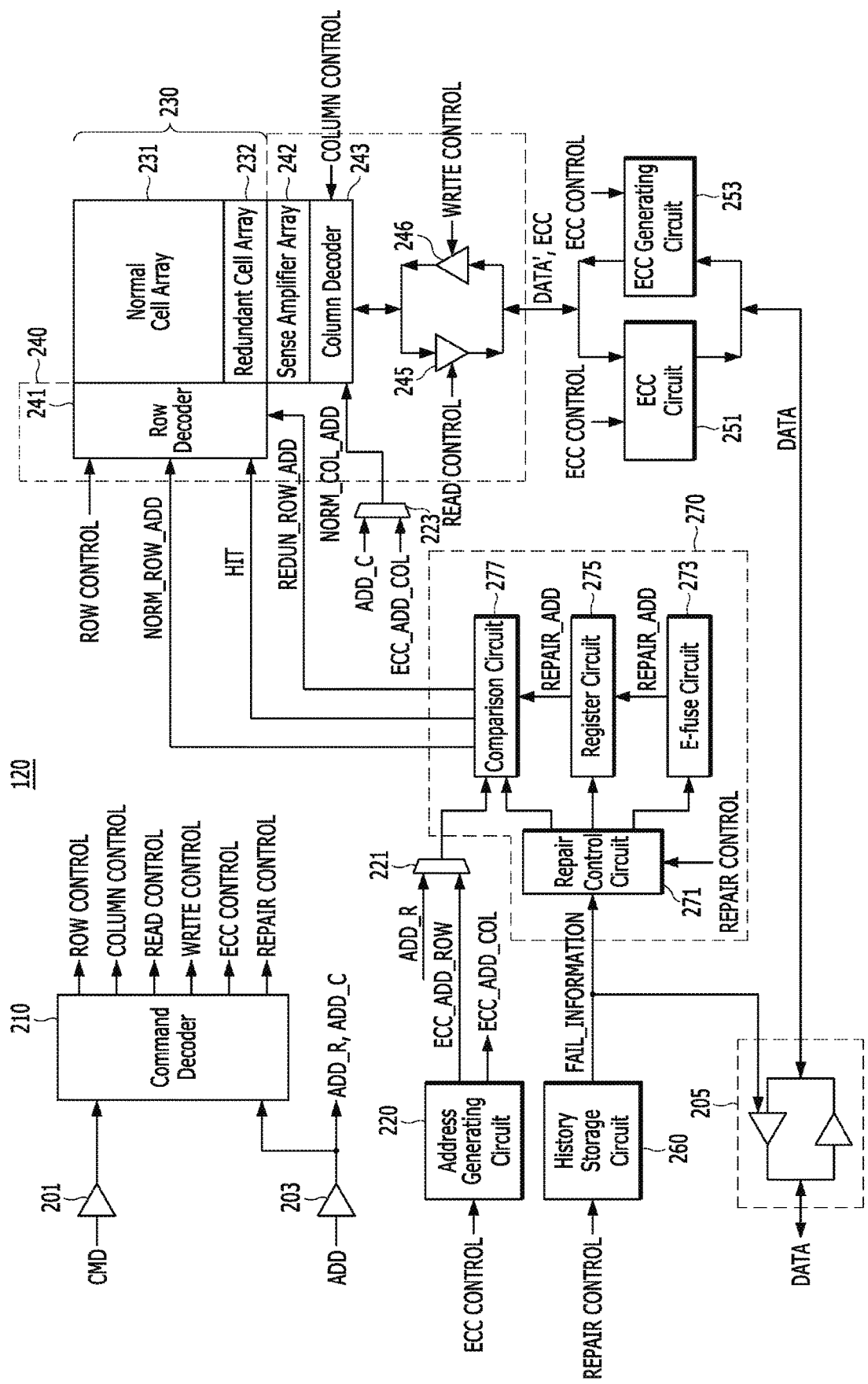
FIG. 2 is a block diagram illustrating a memory shown in FIG. 1.

FIG. 2 is a block diagram illustrating a memory 120 shown in FIG. 1.

Referring to FIG. 2, the memory 120 may include a command receiving circuit 201, an address receiving circuit 203, a data transferring and receiving (transferring/receiving) circuit 205, a command decoder 210, an address generating circuit 220, a cell array 230, an access circuit 240, an error correction code generating circuit 253, an error correction circuit (i.e., ECC circuit) 251, a history storage circuit 260, and a repair circuit 270.

The command receiving circuit 201 may receive a command CMD transferred from the memory interface 117 of the memory controller 110. The address receiving circuit 203 may receive an address ADD transferred from the memory interface 117 of the memory controller 110. The address ADD may be received by the address receiving circuit 203 together with a row-based command, for example, an active command, which may be classified as a row address ADD_R. Also, the address ADD may be received by the address receiving circuit 203 together with a column-based command, for example, a read command and a write command, which may be classified as a column address ADD_C. The data transferring/receiving circuit 205 may receive data DATA transferred from the memory interface 117 during a write operation and transfer data DATA to the memory interface 117 during a read operation.

The command decoder 210 may decode a command CMD received through the command receiving circuit 201 to detect an operation directed by the memory controller 110. The command decoder 210 may decode not only the command CMD, but also a part of the address ADD together with the command CMD. The command decoder 210 may generate the signals for controlling the constituent elements inside the memory 120 according to an operation directed by the memory controller 110. A signal ROW CONTROL may be a signal for controlling a row decoder 241. A signal COLUMN CONTROL may be a signal for controlling a column decoder 243. A signal READ CONTROL may be a signal for controlling an input/output (IO) sense amplifier 245. A signal WRITE CONTROL may be a signal for controlling a write driver 246. A signal ECC CONTROL may be a signal for controlling constituent elements related to an error correction operation, such as an error correction code generating circuit 251, an error correction circuit 253, and an address generating circuit 220. A signal REPAIR CONTROL may be a signal for controlling the repair circuit 270. The signals ROW CONTROL, COLUMN CONTROL, READ CONTROL, WRITE CONTROL, ECC CONTROL, and REPAIR CONTROL may be multi-bit signals.

The history storage circuit 260 may generate internal addresses that are changed each time an error correction operation is performed. The internal address may include an internal row address ECC_ADD_ROW and an internal column address ECC_ADD_COL. Since the internal addresses ECC_ADD_ROW and ECC_ADD_COL are changed each time an error correction operation is performed, an error correction operation may be performed on the entire cell array 230 when the error correction operation is performed multiple times. In some embodiments, the internal column address ECC_ADD_COL generated by the address generating circuit 220 may be used for a backup operation. During the backup operation, the address generating circuit 220 may increase and change the internal column address ECC_ADD_COL.

A multiplexer 221 may select one of the row address ADD_R received by the address receiving circuit 203 and the internal row address ECC_ADD_ROW generated by the address generating circuit 220 to transfer the selected one to a comparison circuit 277 of the repair circuit 270. In some embodiments, the internal row address ECC_ADD_ROW is used when an error correction operation is performed. In this case, the multiplexer 221 may transfer the internal row address ECC_ADD_ROW to the comparison circuit 277. Otherwise, it may transfer the row address ADD_R to the comparison circuit 277.

The multiplexer 223 may select one of the column address ADD_C received by the address receiving circuit 203 and the internal column address ECC_ADD_COL generated by the address generating circuit 220 and may transfer the selected one to the column decoder 243. In some embodiments, the internal column address ECC_ADD_COL is used when an error correction operation is performed. In this case, the multiplexer 223 may transfer the internal column address ECC_ADD_COL to the column decoder 243. Otherwise, it may transfer the column address ADD_C to the column decoder 243.

The cell array 230 may include a plurality of memory cells that are arranged between a plurality of rows and a plurality of columns. The cell array 230 may include a normal cell array 231 including normal memory cells and a redundant cell array 233 including redundant memory cells.

The access circuit 240 may write data and an error correction code corresponding to the data into the cell array 230 and read data and an error correction code corresponding to the data from the cell array 230. The access circuit 240 may include the row decoder 241, the sense amplifier array 242, the column decoder 243, the IO sense amplifier 245, and the write driver 246.

The row decoder 241 may select a row (i.e., word line) to be accessed from the cell array 230. A normal row address NORM_ROW_ADD inputted to the row decoder 241 may be an address for selecting a row to be accessed in the normal cell array 231. A redundant row address REDUN_ROW_ADD may be a row to be accessed in the redundant cell array 232. The row decoder 241 may activate the row which is selected based on the normal row address NORM_ROW_ADD when the hit signal HIT is deactivated. The row decoder 241 may activate the row which is selected based on the redundant row address REDUN_ROW_ADD when the hit signal HIT is activated.

The sense amplifier array 242 may sense and amplify the data and the error correction code of the row selected by the row decoder 241.

The column decoder 243 may select columns (i.e., bit lines) to be accessed from the cell array 230 in response to the column address NORM_COL_ADD. Data and error correction codes of the columns that are selected by the column decoder 243 may be selected among the data and the error correction codes that are sensed and amplified by the sense amplifier array 242.

During a read operation, the IO sense amplifier 245 may transfer data DATA' and an error correction codes ECC of columns that are selected by the column decoder 243 to the error correction circuit 251.

During a write operation, the write driver 246 may transfer the data DATA' and the error correction code ECC transferred from the error correction code generating circuit 253 to the columns selected by the column decoder 243.

During a write operation, the error correction code generating circuit 251 may generate an error correction code ECC based on the data DATA. Only an error correction code ECC may be generated by using the data DATA, but an error of the data DATA may not be corrected. Thus, the data DATA inputted to the error correction code generating circuit 251 and the data DATA' outputted from the error correction code generating circuit 251 may be the same.

During a read operation, the error correction circuit 253 may correct an error in the data DATA' based on an error correction code ECC. To be specific, the error correction circuit 253 may detect an error in the data DATA' based on an error correction code ECC and correct the detected error in the data DATA'. When an error of the data DATA' is detected and the detected error is corrected, the data DATA' inputted to the error correction circuit 253 and the data DATA outputted from the error correction circuit 253 may be different.

The history storage circuit 260 may determine a row with many errors among the rows of the normal cell array 231 as a repair-requiring row based on error information ERR received from the error correction circuit 253. For example, the history storage circuit 260 may determine a row in which the number of errors is greater than or equal to a threshold value among the rows of the normal cell array as a repair-requiring row. FAIL_INFORMATION in the drawing may represent information regarding a repair-requiring row stored in the history storage circuit 260.

The repair circuit 270 may replace a portion of the normal cell array 231 with a redundant region of the redundant cell array 232. The repair circuit 270 may include a repair control circuit 271, an e-fuse circuit 273, a register circuit 275, and a comparison circuit 277.

The repair control circuit 271 may control the overall repair operation. The e-fuse circuit 273 may store defective addresses. The register circuit 275 may receive and temporarily store the defective addresses REPAIR_ADD stored in the e-fuse circuit 273 by a boot-up operation. The comparison circuit 277 may compare the defective addresses REPAIR_ADD stored in the register circuit 275 with the row address transferred from the multiplexer 221. When the row address transferred from the multiplexer 221 does not coincide with the defective addresses REPAIR_ADD stored in the register circuit 275, the comparison circuit 277 may deactivate a hit signal HIT and transfer the row address transferred from the multiplexer 221 as the normal row address NORM_ROW_ADD. In this case, a row of the normal cell array 231 may be accessed by the row decoder 241. When the row address transferred from the multiplexer 221 coincides with one among the defective addresses REPAIR_ADD stored in the register circuit 275, the comparison circuit 277 may activate the hit signal HIT and transfer a redundant row address REDUN_ROW_ADD to the row decoder 241. In this case, a row of the redundant cell array 232 may be accessed by the row decoder 241.

The repair may include a hard repair, which is a permanent repair, and a soft repair, which is a temporary repair. When a defective address is programmed in the e-fuse circuit 273, the defective address may be permanently repaired. Thus, it is referred to as a hard repair. When a defective address is stored only in the register circuit 275, the repair effect may be maintained only while the power of the memory 120 remains. Therefore, it is called soft repair.

FIG. 2 exemplarily illustrates a row repair operation in which the repair circuit 270 replaces a defective normal row with a redundant row. However, those skilled in the art would recognize that a column repair operation in which the repair circuit 270 replaces a defective normal column with a redundant column may be performed.

Figure 3:
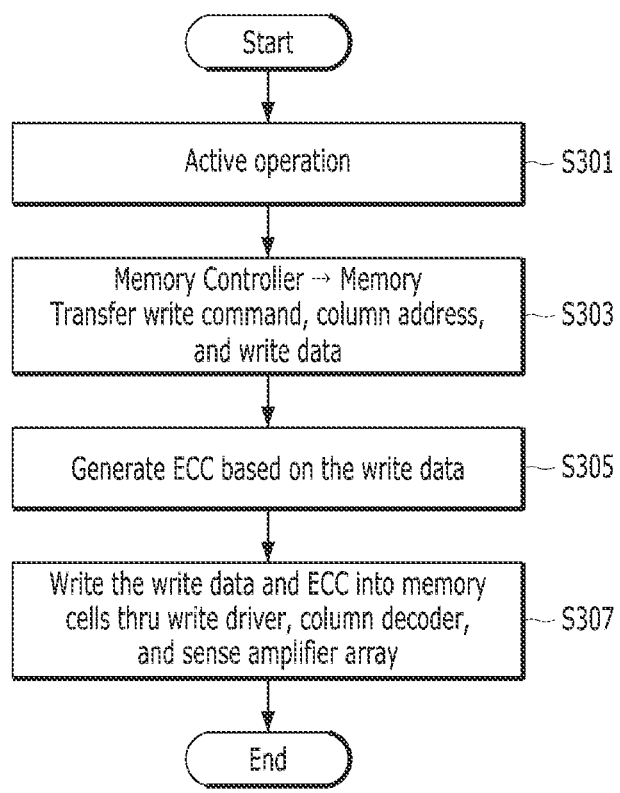
FIG. 3 is a flowchart describing an embodiment of a write operation performed in the memory system shown in FIG. 1.

FIG. 3 is a flowchart describing an embodiment of a write operation performed in the memory system 100 shown in FIG. 1.

Referring to FIG. 3, to perform a write operation, an active operation may have to be performed first in step S301. The active operation may begin by transferring a row address ADD from the memory controller 110 to the memory 120 together with an active command CMD. In an active operation, a row address ADD_R received by the address receiving circuit 203 may be transferred to the comparison circuit 277 through the multiplexer 221. The comparison circuit 277 may transfer the normal row address NORM_ROW_ADD or the redundant row address REDUN_ROW_ADD to the row decoder 241 based on the comparison result of the row address ADD_R and the defective addresses REPAIR_ADD. The row to be accessed by the row decoder 241 may be selected, and the data and the error correction code of the row selected by the row decoder 241 may be sensed and amplified by the sense amplifier array 242.

After the active operation, a write command CMD, a column address ADD, and write data DATA may be transferred from the memory controller 110 to the memory 120 in step S303. The command CMD may be transferred to the command decoder 210 through the command receiving circuit 201. The command decoder 210 may decode the command CMD to recognize that the transferred command CMD is a write command and to control the related constituent elements. The column address ADD may be transferred to the column decoder 243 through the address receiving circuit 203 and the multiplexer 223.

The write data DATA received by the data transferring/receiving circuit 205 may be transferred to the error correction code generating circuit 251. The error correction code generating circuit 251 may generate an error correction code (ECC) based on the write data DATA in step S305. The number of the bits of the write data DATA and the number of the bits of the error correction code ECC may be different depending on the embodiment of the present invention. Hereinafter, the write data DATA is 128 bits and the error correction code ECC is 8 bits.

The write data DATA' and the error correction code ECC may be transferred to the sense amplifier array 242 through the write driver 246 and the column decoder 243, and may be written into selected memory cells in step S307. Here, the selected memory cells may be memory cells corresponding to the rows selected by the row decoder 241 and the columns selected by the column decoder 243 in the cell array 230.

Figure 4:
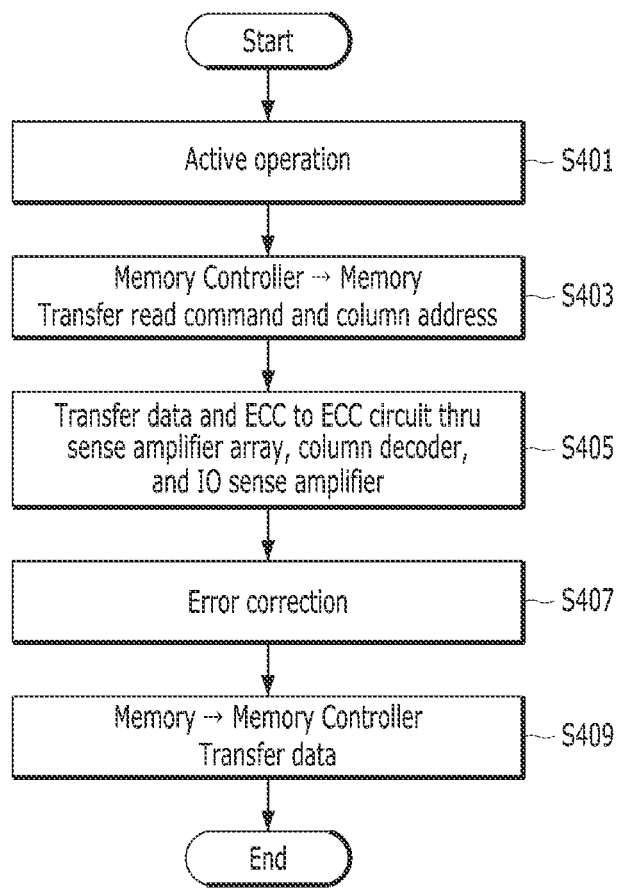
FIG. 4 is a flowchart describing an embodiment of a read operation performed in the memory system of FIG. 1.

FIG. 4 is a flowchart describing an embodiment of a read operation performed in the memory system 100 of FIG. 1.

Referring to FIG. 4, to perform a read operation, an active operation may have to be performed first in step S401. The active operation performed prior to a read operation may be performed in the same manner as the active operation performed prior to a write operation.

After the active operation, a read command CMD and a column address ADD may be transferred from the memory controller 110 to the memory 120 in step S403. The command decoder 210 may decode the command CMD to recognize that the transferred command CMD is a read command and to control related constituent elements. The column address ADD may be transferred to the column decoder 243 through the address receiving circuit 203 and the multiplexer 223.

Among the data and the error correction codes that are sensed and amplified by the sense amplifier array 242, the data DATA' and the error correction codes ECC of the columns selected by the column decoder 243 may be transferred to the error correction circuit 253 through the IO sense amplifier 245 in step S405.

The error correction circuit 253 may correct an error in the data DATA' based on the error correction code ECC in step S407. To be specific, the error correction circuit 253 may detect an error in the data DATA' based on the error correction code ECC and correct the detected error in the data DATA'. When the data DATA' is 128 bits and the error correction code ECC is 8 bits, the error correction circuit 253 may correct an error of 1 bit occurring in the data DATA'.

As a result, the data DATA whose error is corrected by the error correction circuit 253 may be transferred to the memory controller 110 through the data transferring/receiving circuit 205 in step S409.

Figure 5:
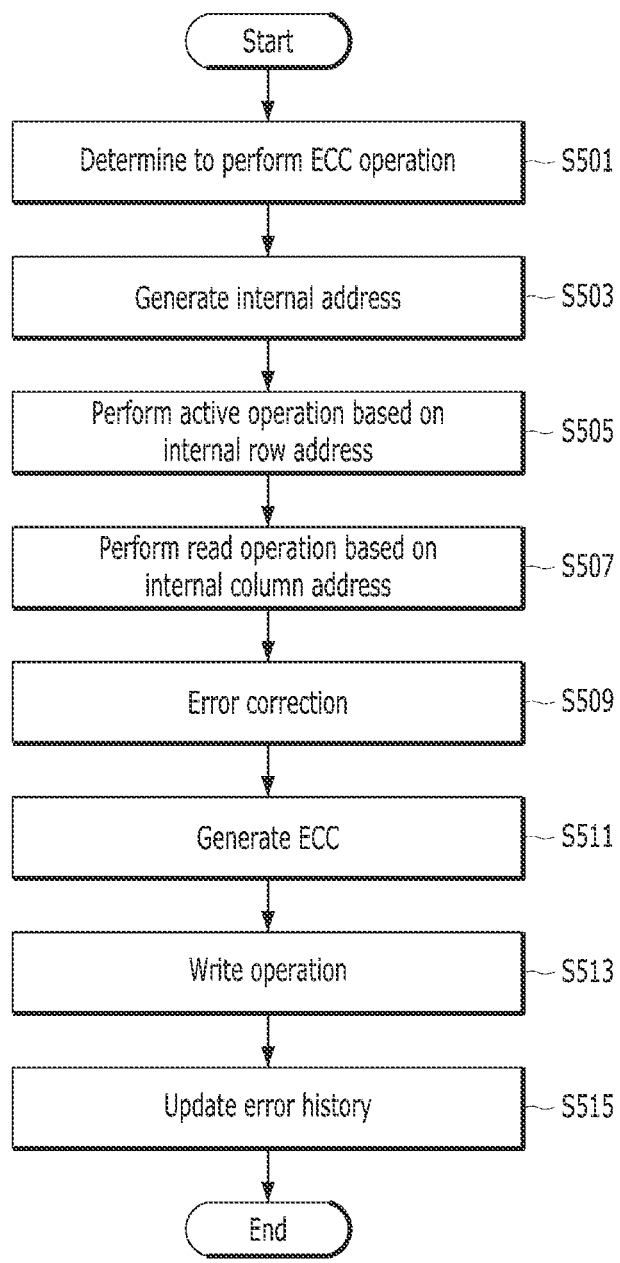
FIG. 5 is a flowchart describing an embodiment of an error correction operation performed in the memory system of FIG. 1.

FIG. 5 is a flowchart describing an embodiment of an error correction operation performed in the memory system 100 shown in FIG. 1.

The error correction operation may refer to an operation of reading data of memory cells, correcting an error of the data, and then writing the error-corrected data back into the memory cells. The error correction operation may reduce the errors accumulated in the memory 120. This error correction operation may also be referred to as a scrubbing operation.

Referring to FIG. 5, first, the memory 120 may determine to perform an error correction operation (i.e., ECC operation) in step S501. The error correction operation may be performed by the memory controller 110 transferring an error correction command CMD to the memory 120. The command CMD may be transferred to the command decoder 210 through the command receiving circuit 201. The command decoder 210 may decode the command CMD to recognize that the command CMD is an error correction command and to control related constituent elements. The error correction operation may be determined to be performed by the memory itself, regardless of the command CMD, that is, with no regard to the memory controller 110. For example, the memory 120 may periodically perform an error correction operation or perform an error correction operation in an idle state.

When it is determined to perform an error correction operation, the address generating circuit 220 may generate internal addresses ECC_ADD_ROW and ECC_ADD_COL in step S503. The internal addresses may include an internal row address ECC_ADD_ROW and an internal column address ECC_ADD_COL. The internal addresses ECC_ADD_ROW and ECC_ADD_COL may be changed whenever an error correction operation is performed. The internal row address ECC_ADD_ROW may be transferred to the comparison circuit 277 through the multiplexer 221. The comparison circuit 277 may transfer a normal row address NORM_ROW_ADD or a redundant row address REDUN_ROW_ADD to the row decoder 241 according to the comparison result of the internal row address ECC_ADD_ROW and the defective addresses REPAIR_ADD. Also, the internal column address ECC_ADD_COL may be transferred to the column decoder 243 through the multiplexer 223.

An active operation based on the internal row address ECC_ADD_ROW may be performed in step S505. The row to be accessed by the row decoder 241 may be selected. The data and the error correction code of the row selected by the row decoder 241 may be sensed and amplified by the sense amplifier array 242.

A read operation based on the internal column address ECC_ADD_COL may now be performed in step S507. Among the data and the error correction codes that are sensed and amplified by the sense amplifier array 242, the data DATA' and the error correction codes ECC of the columns selected by the column decoder 243 may be transferred to the error correction circuit 253 through the IO sense amplifier 245.

The error correction circuit 253 may correct an error in the data DATA' based on the error correction code ECC in step S509. The data DATA whose error is corrected by the error correction circuit 253 may not be transferred to the memory controller 110 but may be transferred to the error correction code generating circuit 251.

The error correction code generating circuit 251 may generate an error correction code ECC based on the data DATA whose error is corrected by the error correction circuit 253 in step S511.

Subsequently, an operation of writing the data DATA' and the error correction code ECC outputted from the error correction code generating circuit 251 may be performed in step S513. The data DATA and the error correction code ECC may be transferred to the sense amplifier array 242 through the write driver 246 and the column decoder 243, and may be written into memory cells. In other words, the data and the error correction code of the memory cells may be read, and after errors are corrected, the data and the error correction code may be written back into the same memory cells.

Error information ERR of the error correction circuit 253 may be transferred to the history storage circuit 260. The history storage circuit 260 may update the error history in step S515.

The errors accumulated in the memory 120 may be reduced by performing the error correction operation several times, and the history storage circuit 260 may update the information about rows having many errors, that is, repair-requiring rows.

Figure 6:
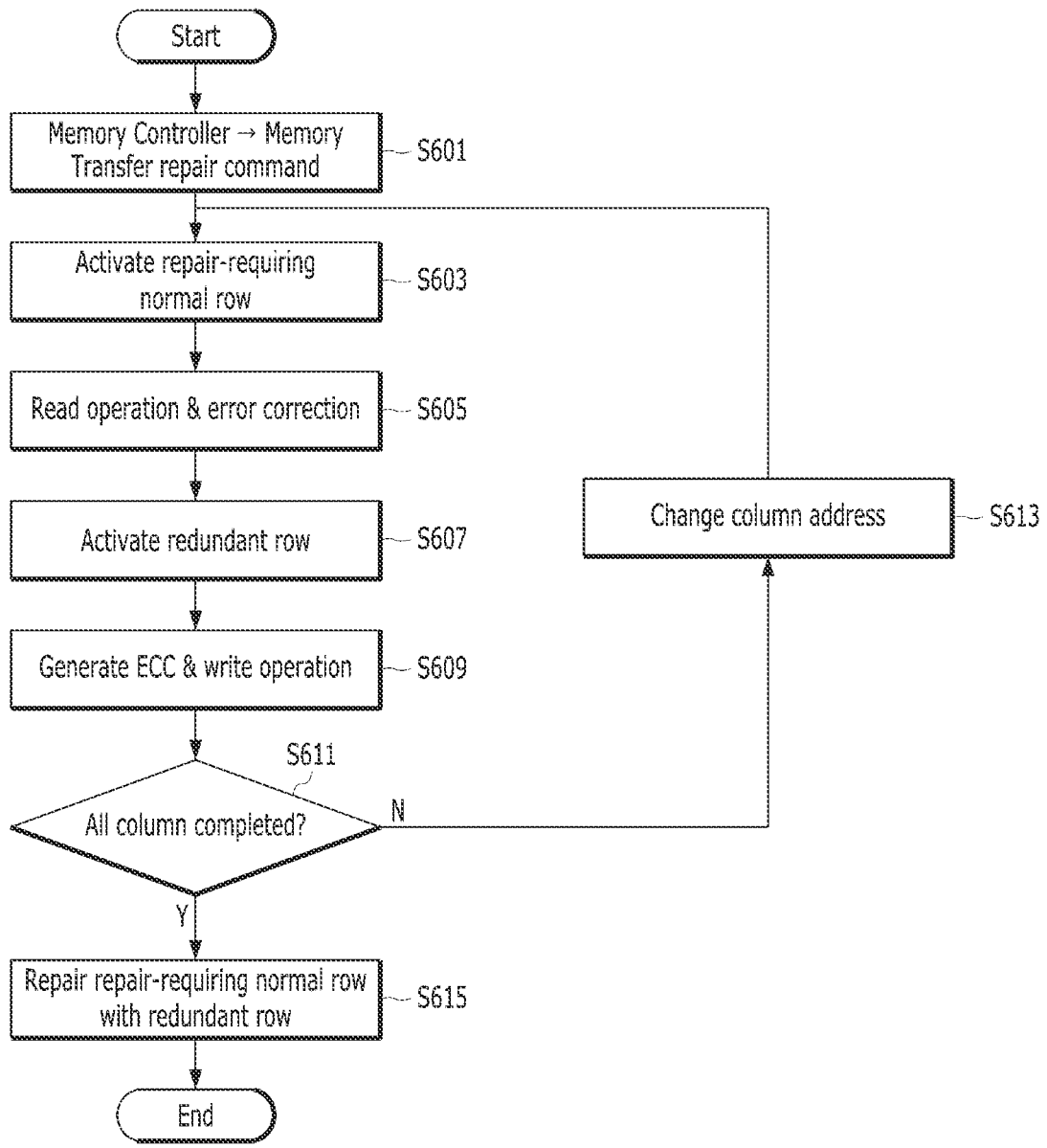
FIG. 6 is a flowchart describing a first embodiment of a repair operation performed in the memory system of FIG. 1.

FIG. 6 is a flowchart describing a first embodiment of a repair operation performed in the memory system 100 of FIG. 1. Here, the repair operation may refer to an operation of repairing a repair-requiring region stored in the history storage circuit 260.

Referring to FIG. 6, first, the memory controller 110 may transfer a repair command CMD to the memory 120 in step S601. The command CMD may be transferred to the command decoder 210 through the command receiving circuit 201. The command decoder 210 may decode the command CMD to recognize that the command CMD is a repair command and to control related constituent elements.

All of the following operations may be performed by the memory 120 itself without control of the memory controller 110. Hereinafter, the repair-requiring region stored in the history storage circuit 260 is a third normal row of the normal cell array 231 and a redundant region to be replaced with the third normal row is a first redundant row of the redundant cell array 233.

A repair-requiring normal row, that is, the third normal row, may be activated by the repair circuit 270 and the row decoder 241 in step S603. Accordingly, the data and the error correction code of the third normal row may be sensed and amplified by the sense amplifier array 242.

A read operation may be performed in step S605 after the active operation of step S603. The data DATA' and the error correction code ECC of the columns selected by the column decoder 243 may be transferred to the error correction circuit 253 through the IO sense amplifier 245. The error of the data DATA' may be corrected by the error correction circuit 253. Here, the column decoder 243 may use the internal column address ECC_ADD_COL generated by the address generating circuit 220.

The active target may be changed from the repair-requiring normal row to a redundant row, that is, a first redundant row in step S607. That is, the first redundant row may be activated by the repair circuit 270 and the row decoder 241. Accordingly, the data and the error correction code of the first redundant row may be sensed and amplified by the sense amplifier array 242.

A write operation may be performed in step S609 after the active operation of step S607. The error correction code generating circuit 251 may receive the data DATA whose error is corrected by the error correction circuit 253 in the step 605 and generate an error correction code ECC. The data DATA' and the error correction code ECC may be transferred to the sense amplifier array 242 through the write driver 246 and the column decoder 243 to be written in the memory cells corresponding to the first redundant row selected by the row decoder 241 and the columns selected by the column decoder 243.

The operations steps S603, S605, S607, and S609 may be repeated while changing the column address until the data of all columns of the normal row are backed up into the redundant row in steps S611 and S613. The data of the third normal row may be backed up to the first redundant row by repeatedly performing the operations of the steps S603, S605, S607, and S609 while changing the internal column address ECC_ADD_COL.

After the backup operation is completed, the repair circuit 270 may repair the repair-requiring normal row (i.e., the third normal row) with the redundant row (i.e., first redundant row) in step S615. Here, the repair may be a soft repair or a hard repair.

After the repair operation is completed, the memory may notify the memory controller that the repair operation is completed (not shown).

According to the first embodiment of the repair operation, when the memory controller 110 applies a repair command to the memory 120, the memory 120 may back up the data of the repair-requiring normal row into a redundant row, and then replace (or repair) the repair-requiring normal row with the redundant row.

Figure 7:
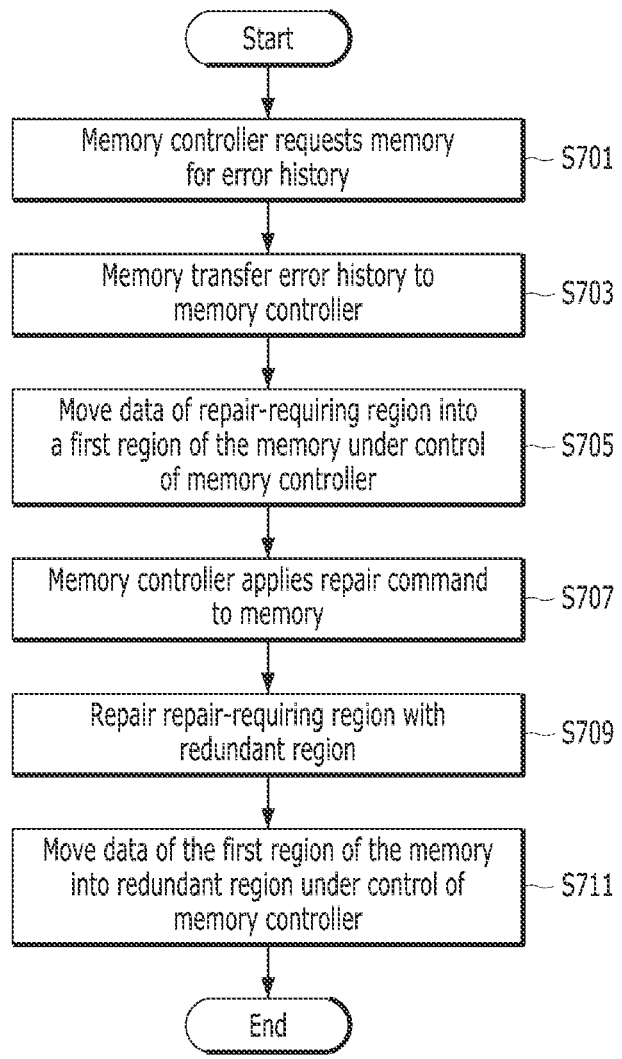
FIG. 7 is a flowchart describing a second embodiment of a repair operation performed in the memory system of FIG. 1.

FIG. 7 is a flowchart describing a second embodiment of a repair operation performed in the memory system 100 of FIG. 1.

Referring to FIG. 7, first, the memory controller 110 may transfer a command CMD requesting information FAIL_INFORMATION stored in the history storage circuit 260 to the memory 120 in step S701. The command CMD may be transferred to the command decoder 210 through the command receiving circuit 201. The command decoder 210 may decode the command CMD to determine that the information stored in the history storage circuit 260 is requested.

In step S703, the memory 120 may transfer the information FAIL_INFORMATION stored in the history storage circuit 260 to the memory controller 110 through the data transferring/receiving circuit 205 in response to the request of the step S701. Accordingly, the memory controller 110 may be able to determine that a region which needs to be repaired in the memory 120 is the third normal row.

In step S705, according to the control of the memory controller 110, data in the repair-requiring region, which is the third normal row, may be moved to another region of the memory (e.g., a $10^{th}$ normal row). This operation may be performed by the memory controller 110, by repeatedly performing reading the data of the third normal row, storing the data in the temporary memory 119 of the memory controller 110, and writing the data stored in the temporary memory 119 into the $10^{th}$ normal row. In other words, the operation of step S705 may be performed by repeatedly performing a general read operation and a general write operation.

The memory controller 110 may apply a repair command CMD to the memory 120 in step S707. It may be seen that the command CMD is transferred to the command decoder 210 through the command receiving circuit 201 and the command decoder 210 decodes the command CMD to confirm that a repair is requested.

In response to the repair command, the memory 120 may repair the repair-requiring normal region (e.g., the third normal row) with a redundant region (e.g., a first redundant row) in step S709. After the repair operation, the first redundant row may be accessed instead of the third normal row.

In step S711, the data that are moved to another region (e.g., the $10^{th}$ normal row) may be moved to the redundant region under the control of the memory controller 110. This operation may be performed by the memory controller 110, by repeatedly performing reading the data of the $10^{th}$ normal row, storing the data in the temporary memory 119 of the memory controller 110, and writing the data stored in the temporary memory 119 to the first redundant row. In other words, the operation of step S711 may be performed by repeatedly performing a general read operation and a general write operation.

According to the second embodiment of the present invention, first, the data of the repair-requiring normal region (e.g., the third normal row) may be moved to another normal region (e.g., the $10^{th}$ normal row) under the control of the memory controller 110. Also, the repair-requiring normal region (e.g., the third normal row) may be repaired with the redundant region (e.g., the first redundant row) under the control of the memory controller 110. Thus, the data that are moved to another normal region (e.g., the $10^{th}$ normal row) may be moved to the redundant region (e.g., the first redundant row) under the control of the memory controller 110. Thereby, the normal region (e.g., the third normal row) may be repaired with the redundant region (e.g., the first redundant row), and the data of the normal region (e.g., the third normal row) may be backed up into the redundant region (e.g., the first redundant row).

Figure 8:
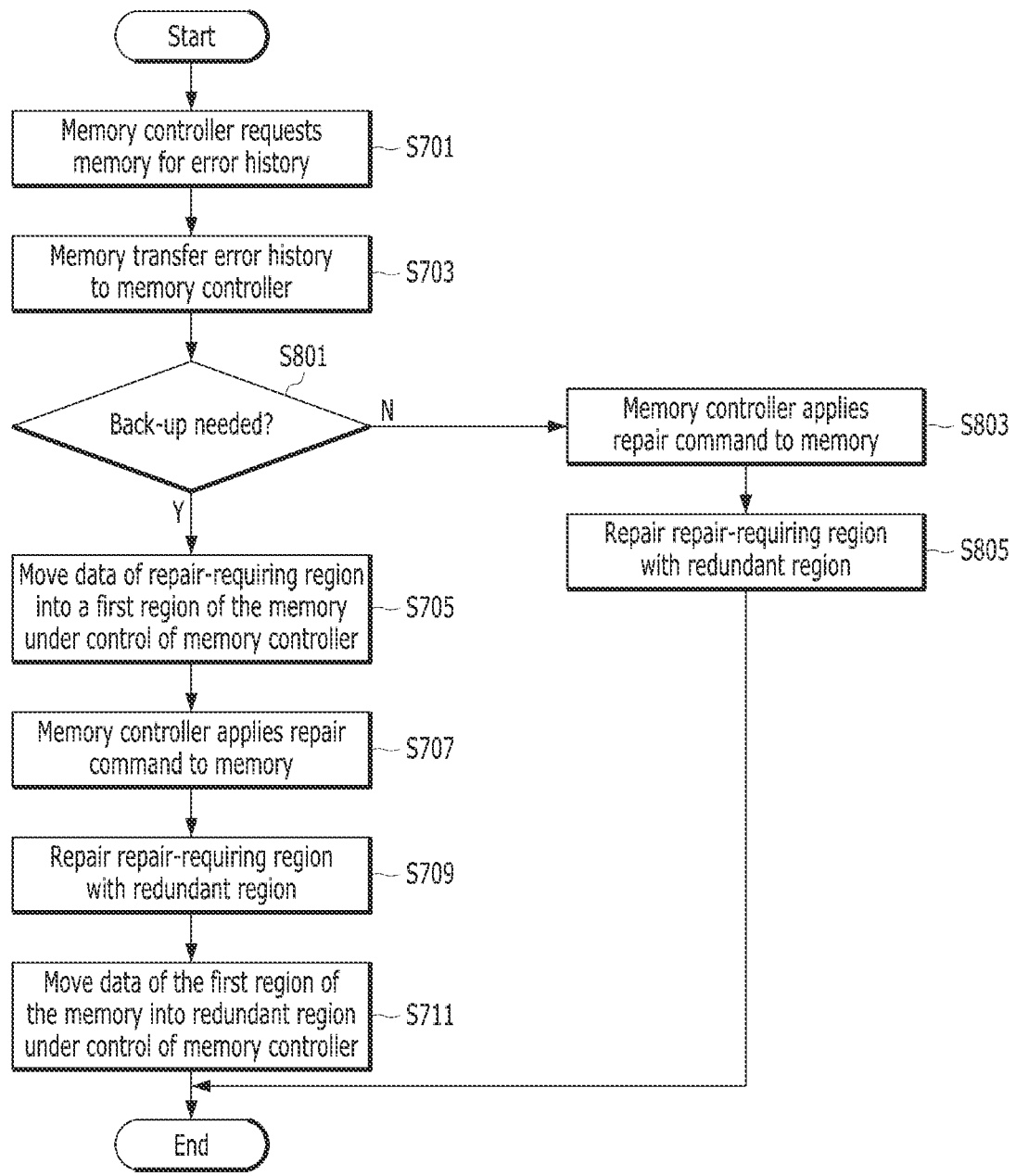
FIG. 8 is a flowchart describing a third embodiment of a repair operation performed in the memory system of FIG. 1.

FIG. 8 is a flowchart describing a third embodiment of a repair operation performed in the memory system 100 of FIG. 1. In the third embodiment of the present invention, the operations of steps S801, S803, and S805 may be added to the operations of the second embodiment of the present invention as shown in FIG. 7.

Referring to FIG. 8, in step S801, the control block 113 of the memory controller 110 may determine whether or not it is necessary to back up the data stored in the repair-requiring region (e.g., the third normal row) based on the information transferred in step S703. That is, it is possible to determine whether or not the data stored in the third normal row are data needed for a future operation.

When it is determined that the data stored in the repair-requiring region need to be backed up (Y in the decision of step S801), the operations of steps S705, S707, S709, and S711 may be performed.

When it is determined that there is no need to back up the data stored in the repair-requiring region (N in step S801), the memory controller 110 may apply a repair command CMD to the memory 120 in step S803. The command CMD may be transferred to the command decoder 210 through the command receiving circuit 201, and the command decoder 210 may decode the command CMD to confirm that a repair is requested.

In response to the repair command, the memory 120 may repair the repair-requiring normal region (e.g., the third normal row) with the redundant region (e.g., the first redundant row) in step S805.

According to the third embodiment of the present invention, when the data stored in the repair-requiring region are not needed, a backup operation may be omitted and only a repair operation may be performed.

FIG. 9 is a flowchart describing a fourth embodiment of a repair operation performed in the memory system 100 of FIG. 1.

Referring to FIG. 9, first, the memory controller 110 may transfer a command CMD requesting the information FAIL_INFORMATION stored in the history storage circuit 260 to the memory 120 in step S901. The command CMD may be transferred to the command decoder 210 through the command receiving circuit 201. The command decoder 210 may decode the command to confirm that the information stored in the history storage circuit 260 is requested.

In step S903, the memory 120 may transfer the information FAIL_INFORMATION stored in the history storage circuit 260 to the memory controller 110 through the data transferring/receiving circuit 205 in response to the request of the step S901. Accordingly, the memory controller 110 may confirm that repair-requiring region in the memory 120 is the third normal row.

The memory controller 110 may transfer an active command and a read command to the memory 120 to read the data in the repair-requiring region. In response to the active command and the read command, an active operation and a read operation may be performed in the memory 120 in step S905. Accordingly, the data in the repair-requiring region (that is, the third normal row) may be transferred from the memory 120 to the memory controller 110. The data transferred from the memory 120 to the memory controller 110 may be stored in the temporary memory 119 of the memory controller 110.

The memory controller 110 may transfer a repair command for repairing the repair-requiring region to the memory 120. In response to the repair command, the memory 120 may be repaired in step S907. That is, the third normal row of the memory 120 may be replaced with the first redundant row. This operation may allow the first redundant row to be accessed and does not allow the third normal row to be accessed.

In order for the memory controller 110 to write the data that are read in the step S905 into a redundant region, the active command and the read command may be transferred to the memory 120, and an active operation and a write operation may be performed in the memory 120 in step S909. Accordingly, the data that are read in step S905 may be written into the redundant region (i.e., the first redundant row).

The memory controller 110 may transfer a repair cancel command to the memory 120. In response to the repair cancel command, the repair of the memory 120 may be canceled in step S911. Here, the repair cancel command may be a command for cancelling the repair operation right before the current repair operation. The repair cancel command may cancel the previous repair operation in the memory 120. Accordingly, the replacement of the third normal row with the first redundant row may be canceled, whereby the third normal row may be accessed again and the first redundant row may not be accessed.

In order for the memory controller 110 to read the data in the repair-requiring region, an active command and a read command may be transferred to the memory 120. In response to the active command and the read command, an active operation and a read operation may be performed in the memory 120 in step S913. Accordingly, the data of the repair-requiring region (i.e., the third normal row) may be transferred from the memory 120 to the memory controller 110. The data transferred from the memory 120 to the memory controller 110 may be stored in the temporary memory 119 of the memory controller 110. The data that are read in step S913 may be data in other columns that are different from the data read in step S905.

The memory controller 110 may transfer a re-repair command to the memory 120, and the memory 120 may be repaired again in step S915. Here, the re-repair command may be a command for performing the previous repair operation again. The previous repair operation of the memory 120 may be performed again in response to the repair command. That is, the third normal row may be replaced with the first redundant row again. This operation may allow the first redundant row to be accessed, and does not allow the third redundant row to be accessed.

In order for the memory controller 110 to write the data read in the step S913 into the redundant region, the active command and the read command may be transferred to the memory 120, and an active operation and a write operation may be performed in the memory 120 in step S917. Accordingly, the data that are read in step 913 may be written into a redundant region (i.e., the first redundant row).

The operations of steps S911, S913, S915, and S917 may be repeatedly performed by changing the column address until the data of all of the columns of a normal row are backed up into the redundant row in steps S919 and S921. The data of the third normal row may be backed up into the first redundant row by repeatedly performing the operations of steps S911, S913, S915 and S917 while changing the column address.

When the write operation for all columns is completed (Y in step S919), the repair operation may end. As a result, all of the data of the repair-requiring region (e.g., the third normal row) are backed up into the redundant region (e.g., first redundant row), and the repair-requiring region (e.g., the third normal row) may be replaced with the redundant region (e.g., the first redundant row).

According to the fourth embodiment of the repair operation, the memory 120 may be repaired and then the repairing of the memory 120 may be canceled under the control of the memory controller 110, and all of the data of the repair-requiring region (e.g., the third normal row) may be backed up into the redundant region (e.g., the first redundant row) through the memory controller 110, and the repair-requiring region (e.g., the third normal row) may be replaced with the redundant region (e.g., the first redundant row).

According to the embodiment of the present invention, a technology for reducing errors in a memory and a memory system is provided.

While the present invention has been described with respect to the specific embodiments, it will be apparent to those skilled in the art that various changes and modifications may be made without departing from the spirit and scope of the invention as defined in the following claims.

What is claimed is:

1. A method for operating a memory system, comprising:
determining, by the memory, whether to perform an error correction operation;
generating, by the memory, an internal address in response to the determination of performing the error correction operation;
reading, by the memory, data and an error correction code corresponding to the data from memory cells that are selected based on the internal address;
performing, by the memory, an error correction operation on the data based on the error correction code;
writing, by the memory, error-corrected data and an error correction code corresponding to the error corrected data into the memory cells that are selected based on the internal address;
determining, by the memory, one or more regions among regions as a repair-requiring region based on an error which is detected when the memory performs the error correction operation;
transferring, by the memory, first data read from the repair-requiring region to a memory controller;

applying, by the memory controller, a first command to the memory;

repairing, by the memory, the repair-requiring region with a redundant region of the memory in response to the first command;

transferring, by the memory controller, the first data to the memory such that the first data is written into the redundant region;

applying, by the memory controller, a second command to the memory;

canceling, by the memory, a previous repair operation right before a current repair operation in response to the second command;

transferring, by the memory, second data that are read from the repair-requiring region to the memory controller;

applying, by the memory controller, a third command to the memory;

repairing, by the memory, the repair-requiring region with a redundant region of the memory in response to the third command; and transferring, by the memory controller, the second data to the memory such that the second data is written into the redundant region.

2. The method of claim 1, wherein the error correction operation is determined to be performed in response to a fourth command, which is transferred from the memory controller to the memory, and wherein the first command is a repair command.

3. The method of claim 1, wherein the second command is a command to cancel a previous repair operation, and wherein the third command is a command for performing the previous repair operation again.

4. The method of claim 3, wherein the repair operation is a soft repair operation.

5. A method for operating a memory system, comprising:

determining, by the memory, whether to perform a scrubbing operation;

determining, by the memory, a repair-requiring region based on an error detected when the scrubbing operation is performed;

transferring, by a memory controller, a first command to a memory;

repairing, by the memory, the repair-requiring region of a normal cell array with a redundant region of a redundant cell array in response to the first command;

transferring, by the memory controller, a second command to the memory;

canceling, by the memory, a previous repair operation right before a current repair operation in response to the second command;

transferring, by the memory, first data that are read from the repair-requiring region;

transferring, by the memory controller, a third command to the memory;

repairing, by the memory, the repair-requiring region with the redundant region again in response to the third command; and transferring, by the memory controller, the first data to the memory such that the first data is written into the redundant region, wherein the first command is a repair command for repairing the repair-requiring region to the memory, the second command is a command to cancel the previous repair operation, and the third command is a command for performing the previous repair operation again.

6. The method of claim 5, further comprising:

transferring, by the memory controller, a second command to the memory again;

canceling, by the memory, the repair again in response to the second command;

transferring, by the memory, second data that are read from the repair-requiring region to the memory controller;

transferring, by the memory controller, a third command to the memory again;

repairing, by the memory, the repair-requiring region with the redundant region again in response to the third command; and transferring, by the memory controller, the second data to the memory such that the second data is written into the redundant region.

7. The method of claim 5, wherein the repair operation is a soft repair operation.

8. A memory, comprising:

a normal cell array;

a redundant cell array;

an access circuit for accessing the normal cell array and the redundant cell array;

an address generating circuit that generates an internal address in response to a determination of performing a scrubbing operation;

a history storage circuit that determines one or more regions among regions of the normal cell array as a repair-requiring region based on an error detected by the error correction circuit during the scrubbing operation, and a repair circuit that performs a repair operation of replacing a portion of the normal cell array with a redundant region of the redundant cell array when a first command is applied, cancelling a previous repair operation right before a current repair operation when a second command is applied, and performing the previous repair operation again when a third command is applied, wherein the first command is a repair command, the second command is a command to cancel the previous repair operation, and the third command is a command for performing the previous repair operation again.

9. The memory of claim 8, further comprising:

an error correction code generating circuit that generates an error correction code corresponding to write data based on the write data; and an error correction circuit that corrects an error in read data based on an error correction code corresponding to the read data.

10. The memory of claim 8, wherein the repair operation performed by the repair circuit is a soft repair operation.

* * * * *